(12) United States Patent
Zhong et al.

(10) Patent No.: US 8,671,878 B2
(45) Date of Patent: Mar. 18, 2014

(54) PROFILE AND CD UNIFORMITY CONTROL BY PLASMA OXIDATION TREATMENT

(71) Applicant: Lam Research Corporation, Fremont, CA (US)

(72) Inventors: Qinghua Zhong, Fremont, CA (US); Sung Cho, Fremont, CA (US); Gowri Kamarthy, Pleasanton, CA (US); Linda Braly, Oakland, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 13/629,235

(22) Filed: Sep. 27, 2012

(65) Prior Publication Data

US 2013/0025785 A1    Jan. 31, 2013

Related U.S. Application Data

(62) Division of application No. 12/350,060, filed on Jan. 7, 2009, now Pat. No. 8,298,949.

(51) Int. Cl.
| | | |
|---|---|---|
| *C23C 16/52* | (2006.01) | |
| *H01L 21/311* | (2006.01) | |
| *H01L 21/3065* | (2006.01) | |
| *H01L 21/32* | (2006.01) | |

(52) U.S. Cl.
USPC .... 118/697; 118/723 I; 118/696; 156/345.24; 156/345.48; 156/345.49; 438/694; 438/696; 438/723; 438/770; 438/771

(58) Field of Classification Search
None
See application file for complete search history.

(56) References Cited

U.S. PATENT DOCUMENTS

| | | |
|---|---|---|
| 5,371,036 A | 12/1994 | Lur et al. |
| 6,190,961 B1 | 2/2001 | Lam et al. |
| 6,391,732 B1 | 5/2002 | Gupta et al. |
| 6,797,188 B1 * | 9/2004 | Shen et al. ............... 438/696 |
| 6,842,147 B2 | 1/2005 | Howald et al. |
| 7,204,913 B1 | 4/2007 | Singh et al. |

(Continued)

FOREIGN PATENT DOCUMENTS

WO    WO 2009/057838    5/2009

OTHER PUBLICATIONS

International Search Report dated Aug. 13, 2010 from International Application No. PCT/US2009/069291.

(Continued)

*Primary Examiner* — Jeffrie R Lund
*Assistant Examiner* — Stanislav Antolin
(74) *Attorney, Agent, or Firm* — Beyer Law Group LLP

(57) ABSTRACT

An apparatus for forming spacers is provided. A plasma processing chamber is provided, comprising a chamber wall, a substrate support, a pressure regulator, an antenna, a bias electrode, a gas inlet, and a gas outlet. A gas source comprises an oxygen gas source and an anisotropic etch gas source. A controller comprises a processor and computer readable media. The computer readable media comprises computer readable code for placing a substrate of the plurality of substrates in a plasma etch chamber, computer readable code for providing a plasma oxidation treatment to form a silicon oxide coating over the spacer layer, computer readable code for sputtering silicon to form silicon oxide with the oxygen plasma, computer readable code for providing an anisotropic main etch, computer readable code for etching the spacer layer, computer readable code for removing the substrate from the plasma etch chamber after etching the spacer layer.

15 Claims, 5 Drawing Sheets

(56) References Cited

U.S. PATENT DOCUMENTS

| | | |
|---|---|---|
| 7,273,638 B2 | 9/2007 | Belyansky et al. |
| 7,368,394 B2 * | 5/2008 | Shen et al. .................. 438/722 |
| 7,851,369 B2 * | 12/2010 | Kamp ......................... 438/717 |
| 7,977,390 B2 * | 7/2011 | Ji et al. ........................... 516/67 |
| 8,298,949 B2 * | 10/2012 | Zhong et al. ................. 438/696 |
| 2002/0127813 A1 | 9/2002 | Akram et al. |
| 2003/0022526 A1 | 1/2003 | Vyvoda et al. |
| 2006/0270066 A1 | 11/2006 | Imahayashi |
| 2007/0026677 A1 * | 2/2007 | Ji et al. ......................... 438/689 |
| 2007/0032013 A1 | 2/2007 | Yoon |
| 2007/0199922 A1 * | 8/2007 | Shen et al. ...................... 216/76 |
| 2007/0281491 A1 * | 12/2007 | Kamp ..................... 156/345.24 |
| 2008/0032512 A1 | 2/2008 | Kim |
| 2008/0057729 A1 | 3/2008 | Shen et al. |
| 2008/0156886 A1 | 7/2008 | Tsuchiya |
| 2008/0248619 A1 | 10/2008 | Wu et al. |
| 2009/0130851 A1 | 5/2009 | Hasegawa et al. |
| 2010/0093186 A1 | 4/2010 | Kobayashi et al. |
| 2010/0173496 A1 * | 7/2010 | Zhong et al. .................. 438/696 |

OTHER PUBLICATIONS

Written Opinion dated Aug. 13, 2010 from International Application No. PCT/US2009/069291.
Notice of Allowance dated Aug. 24, 2012 from U.S. Appl. No. 12/350,060.
Final Office Action dated Jun. 27, 2012 from U.S. Appl. No. 12/350,060.
Office Action dated Jan. 31, 2012 from U.S. Appl. No. 12/350,060.
Final Office Action dated Sep. 15, 2011 from U.S. Appl. No. 12/350,060.
Office Action dated Apr. 19, 2011 from U.S. Appl. No. 12/350,060.
Kamioka et al., "An Ellipsometric Study of the Effect of DC Bias of the Plasma Oxidation of Silicon" Solid State Communication, vol. 97, No. 6, 1996, pp. 531-534.
Xiao H., Introduction to Semiconductor Manufacturing Technology, Prentice Hall, 2001, pp. 243-244.

\* cited by examiner

PROFILE AND CD UNIFORMITY CONTROL BY PLASMA OXIDATION TREATMENT

CROSS-REFERENCE TO RELATED APPLICATIONS

This application is a divisional of and claims benefit to co-pending U.S. patent application Ser. No. 12/350,060 filed on Jan. 7, 2009, entitled "Profile and CD Uniformity Control By Plasma Oxidation Treatment," by Zhong et al., which is hereby incorporated by reference for all purposes.

BACKGROUND OF THE INVENTION

The present invention relates to forming semiconductor devices. More specifically, the present invention relates to profile and CD uniformity control of spacers in the formation of semiconductor devices.

During semiconductor wafer processing, spacers, such as nitride spacers, may be used for etch or implantation masks.

SUMMARY OF THE INVENTION

To achieve the foregoing and in accordance with the purpose of the present invention, in one embodiment, a method of forming spacers from a non-silicon oxide, silicon containing spacer layer with horizontal surfaces and sidewall surfaces over a substrate is provided. A plasma oxidation treatment is provided to form a silicon oxide coating over the spacer layer, wherein the silicon oxide coating provides a horizontal coating on the horizontal surfaces and sidewall coatings on the sidewall surfaces of the spacer layer. An anisotropic main etch that selectively etches horizontal surfaces of the spacer layer and silicon oxide coating with respect to sidewall surfaces of the spacer layer and the sidewall coatings of the silicon oxide coating is provided. The spacer layer is etched, wherein the sidewall coatings of the silicon oxide coating protect sidewall surfaces of the spacer layer.

In another manifestation of the invention a method for forming spacers from a non-silicon oxide, silicon containing spacer layers with horizontal surfaces and sidewall surfaces over a plurality of substrates is provided. (a) A substrate with a spacer layer that is not silicon oxide, but contains silicon, of the plurality of substrates is placed in a plasma etch chamber before providing the plasma oxidation treatment, wherein the chamber has an antenna. (b) A plasma oxidation treatment is provided to form a silicon oxide coating over the spacer layer, wherein the silicon oxide coating provides a horizontal coating on the horizontal surfaces and sidewall coatings on the sidewall surfaces of the spacer layer, comprising providing an oxygen plasma and providing at least one of sputtering silicon to form silicon oxide with the oxygen plasma or transforming silicon of the spacer layer into silicon oxide. (c) A anisotropic main etch is provided that selectively etches horizontal surfaces of the spacer layer and silicon oxide coating with respect to sidewall surfaces of the spacer layer and the sidewall coatings of the silicon oxide coating. (d) The spacer layer is etched, wherein the sidewall coatings of the silicon oxide coating protect sidewall surfaces of the spacer layer. (e) The substrate is removed from the plasma etch chamber after etching the spacer layer, wherein the providing the plasma oxidation treatment, providing the anisotropic main etch, and selectively etching the spacer layer are performed in the same plasma etch chamber using the antenna. Steps (a) to (e) are repeated until each of the plurality of substrates is processed.

In another manifestation of the invention, an apparatus for forming spacers from non-silicon oxide, silicon containing spacer layer with horizontal surfaces and sidewall surfaces over a substrate is provided. A plasma processing chamber is provided, comprising a chamber wall forming a plasma processing chamber enclosure, a substrate support for supporting a substrate within the plasma processing chamber enclosure, a pressure regulator for regulating the pressure in the plasma processing chamber enclosure, at least one antenna for providing power to the plasma processing chamber enclosure for sustaining a plasma, at least one bias electrode for providing a bias voltage, a gas inlet for providing gas into the plasma processing chamber enclosure, and a gas outlet for exhausting gas from the plasma processing chamber enclosure. A gas source is in fluid connection with the gas inlet and comprises an oxygen gas source and an anisotropic etch gas source. A controller is controllably connected to the gas source, the at least one antenna, and at least one bias electrode and comprises at least one processor and computer readable media. The computer readable media comprises computer readable code for placing a substrate of the plurality of substrates in a plasma etch chamber before providing the plasma oxidation treatment, computer readable code for providing a plasma oxidation treatment to form a silicon oxide coating over the spacer layer, wherein the silicon oxide coating provides a horizontal coating on the horizontal surfaces and sidewall coatings on the sidewall surfaces of the spacer layer, comprising computer readable code for providing an oxygen plasma and computer readable code for providing at least one of sputtering silicon to form silicon oxide with the oxygen plasma or transforming silicon of the spacer layer into silicon oxide, computer readable code for providing a anisotropic main etch that selectively etches horizontal surfaces of the spacer layer and silicon oxide coating with respect to sidewall surfaces of the spacer layer and the sidewall coatings of the silicon oxide coating, computer readable code for etching the spacer layer, wherein the sidewall coatings of the silicon oxide coating protect sidewall surfaces of the spacer layer, computer readable code for removing the substrate from the plasma etch chamber after etching the spacer layer, wherein the providing the plasma oxidation treatment, providing the anisotropic main etch, and selectively etching the spacer layer are performed in the same plasma etch chamber.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

During semiconductor wafer processing, spacers, such as nitride spacers may be used for etch or implantation masks. CD control and CD uniformity of the spacers help to improve device reliability and device yield.

Figure 1:
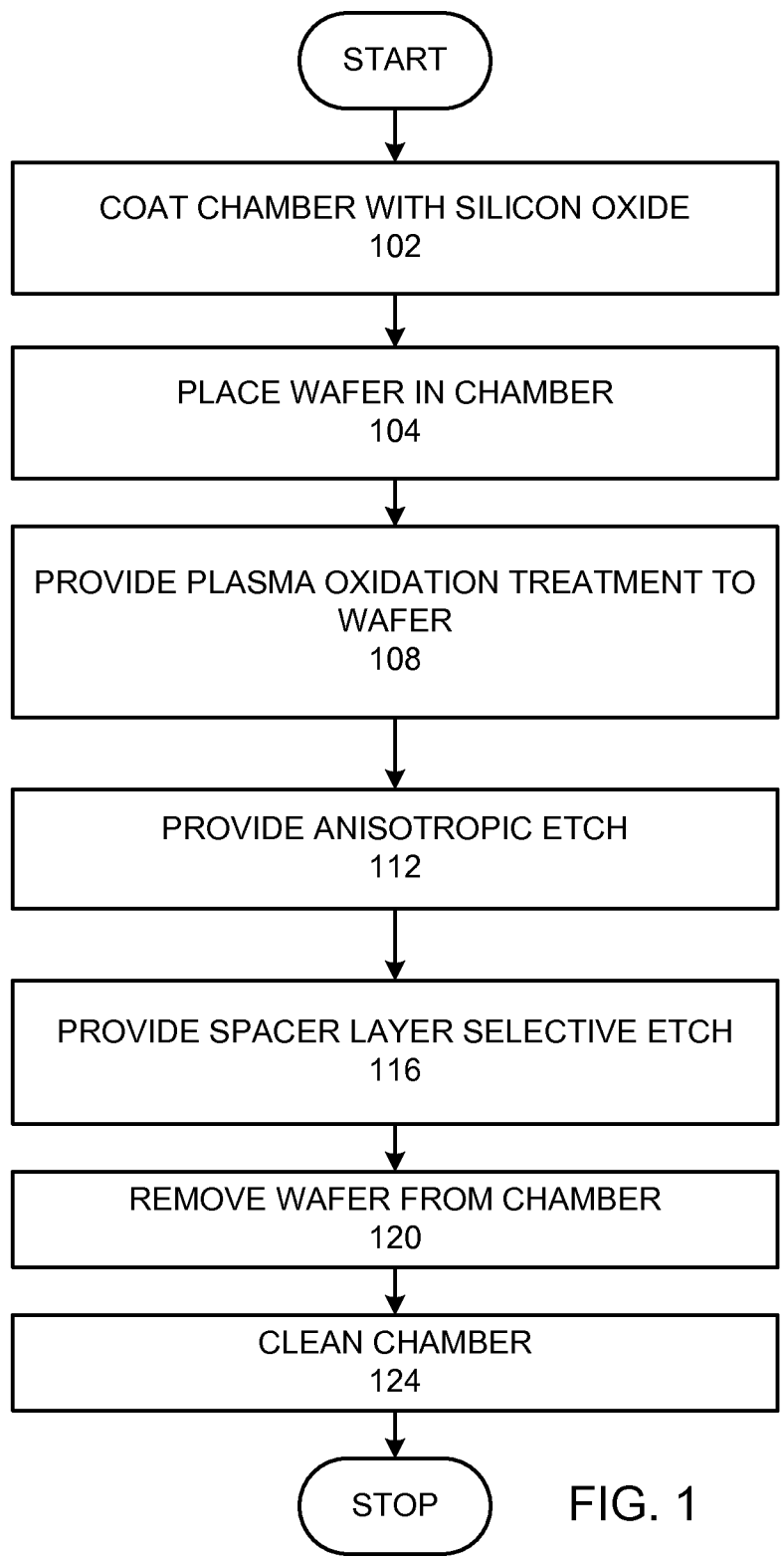
FIG. 1 is a high level flow chart of an embodiment of the invention.

To facilitate understanding, FIG. 1 is a high level flow chart of a process used in an embodiment of the invention. Chamber walls of a plasma processing chamber are coated with a thin silicon oxide layer (step 102). A wafer is placed in a plasma processing chamber (step 104). The wafer is a substrate over which a non-silicon oxide and silicon containing spacer layer is formed with horizontal surfaces and sidewall surfaces. Preferably, some of the sidewall surfaces are vertical. A plasma oxidation treatment is provided to the chamber (step 108). The plasma oxidation treatment forms a silicon oxide coating on the spacer layer by a) transforming silicon of the spacer layer into silicon oxide or b) depositing oxide layer by plasma sputtering oxide pre-coated film on chamber wall or c) sputtering horizontal silicon nitride material reacting with oxygen in the plasma to form silicon oxide and deposit on the sidewall, where the silicon oxide coating provides a horizontal coating on horizontal surfaces and sidewall coatings on the sidewall surfaces of the spacer layer. An anisotropic etch is provided (step 112). The anisotropic etch is preferably a main etch that selectively etches horizontal surfaces of the spacer layer and silicon oxide coating with respect to the sidewall surfaces of the spacer layer and the sidewall coatings of the silicon oxide coatings. A selective etching of the spacer layer with respect to the silicon oxide coating is provided (step 116). The sidewall coating of the silicon oxide coating protects the sidewall surfaces of the spacer layer. The wafer is then removed from the chamber (step 120). The chamber is then cleaned after the wafer is removed (step 124). Therefore, in this embodiment, the chamber is coated before each wafer is added to the chamber and then cleaned after each wafer is removed from the chamber. These steps improve repeatability and uniformity.

Figure 2:
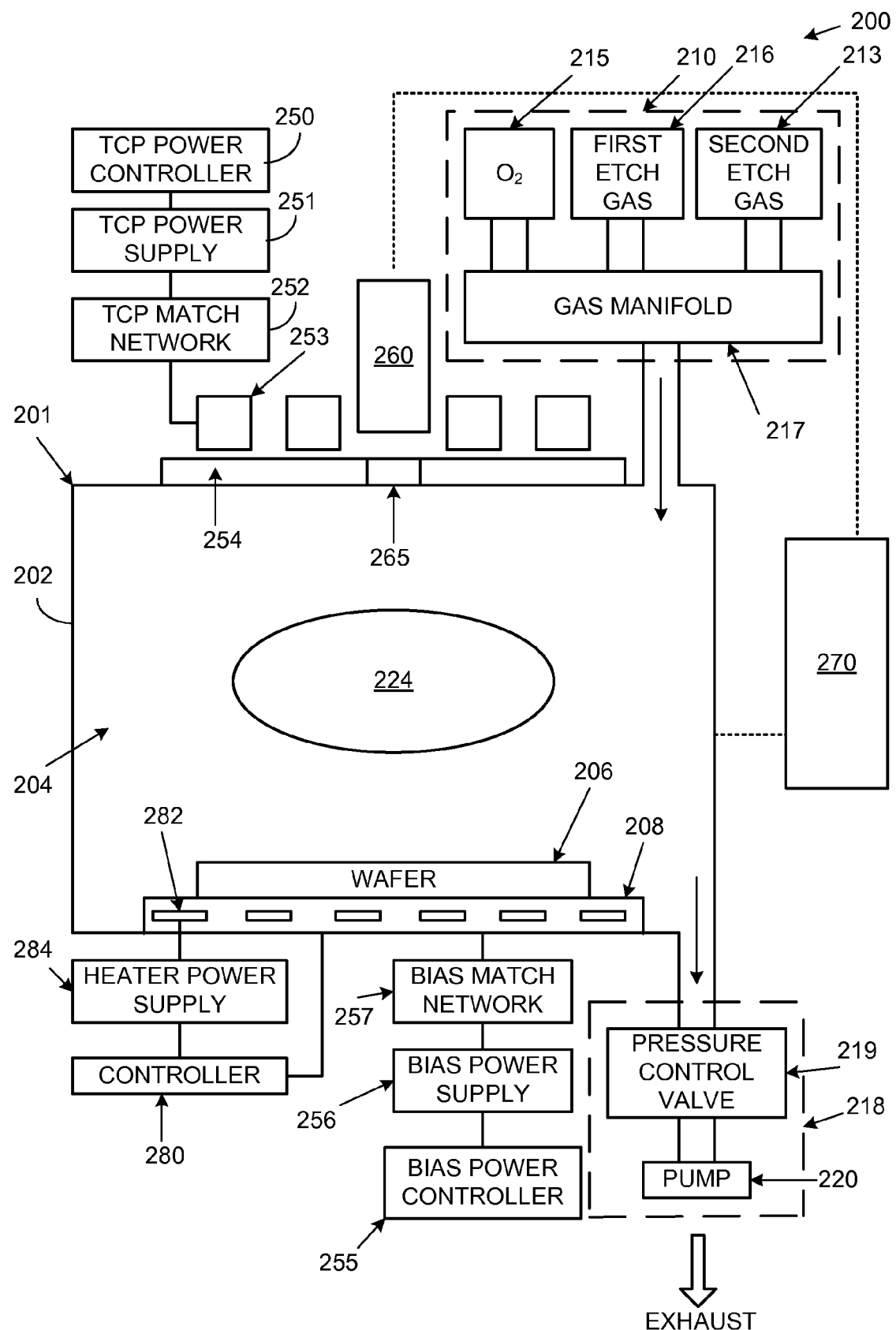
FIG. 2 is a schematic view of a plasma processing chamber that may be used for etching.

To provide a more detailed example of an embodiment of the invention, FIG. 2 is a schematic view of a plasma processing system 200, including a plasma processing tool 201 that may be used as a plasma processing chamber in this embodiment of the invention. The plasma processing tool 201 is an inductively coupled plasma etching tool and includes a plasma reactor 202 having a plasma processing chamber 204 therein. A transformer coupled power (TCP) controller 250 and a bias power controller 255, respectively, control a TCP power supply 251 and a bias power supply 256 influencing the plasma 224 created within plasma chamber 204.

The TCP power controller 250 sets a set point for TCP power supply 251 configured to supply a radio frequency signal at 13.56 MHz, tuned by a TCP match network 252, to a TCP coil 253 located near the plasma chamber 204. An RF transparent window 254 is provided to separate TCP coil 253 from plasma chamber 204 while allowing energy to pass from TCP coil 253 to plasma chamber 204. An optically transparent window 265 is provided by a circular piece of sapphire having a diameter of approximately 2.5 cm (1 inch) located in an aperture in the RF transparent window 254.

The bias power controller 255 sets a set point for bias power supply 256 configured to supply an RF signal, tuned by bias match network 257, to a chuck electrode 208 located within the plasma chamber 204 creating a direct current (DC) bias above electrode 208 which is adapted to receive a substrate 206, such as a semi-conductor wafer work piece, being processed. The bias power controller 255 is also able to pulse the bias power, preferably with a pulse frequency between 1 Hz to 10,000 Hz.

A gas supply mechanism or gas source 210 includes sources of gases attached via a gas manifold 217 to supply the proper chemistry required for the processes to the interior of the plasma chamber 204. One source of gas may be the $O_2$ gas source 215 that supplies the proper chemistry for the plasma oxidation treatment. Another source of gas may be first etch gas source 216 that supplies the proper chemistry for the anisotropic etch. Another source of gas may be a second etch gas source 213 that supplies the proper chemistry for a selective etch. A gas exhaust mechanism 218 includes a pressure control valve 219 and exhaust pump 220, and removes particles from within the plasma chamber 204 and maintains a particular pressure within plasma chamber 204.

A temperature controller 280 controls the temperature of heaters 282 provided within the chuck electrode 208 by controlling a heater power supply 284. The plasma processing system 200 also includes electronic control circuitry 270. The control circuitry 270 may control the temperature controller 280, the gas source 210, the bias power controller 255, and the TCP power controller 250. One or more of these controllers may be integrated into the control circuitry. The plasma processing system 200 may also have an end point detector 260.

Figure 3A:
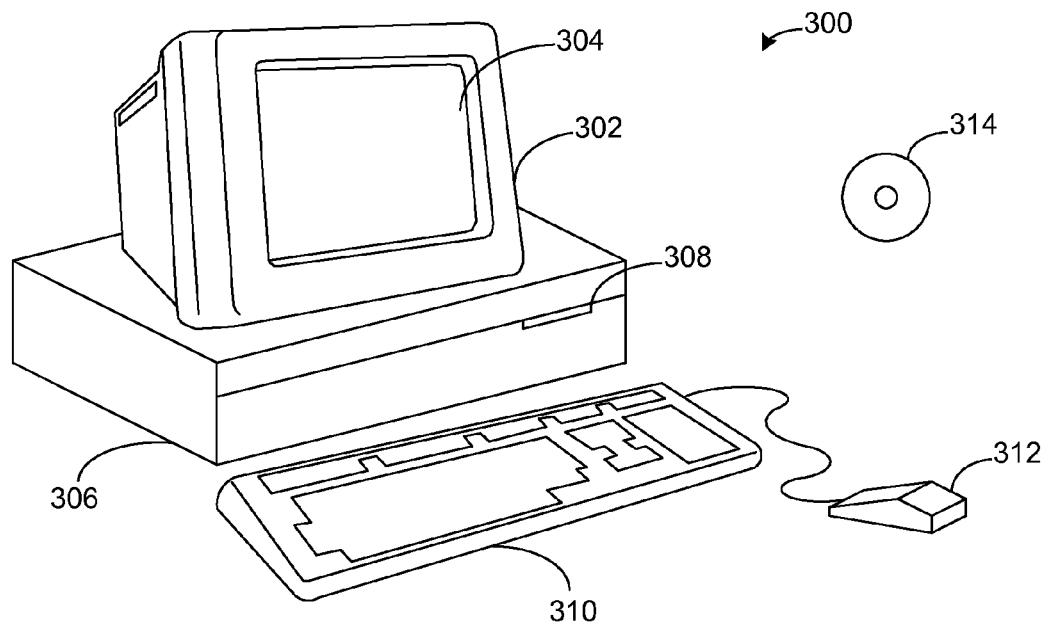
FIGS. 3A-B illustrate a computer system, which is suitable for implementing a controller used in embodiments of the present invention.
Figure 3B:
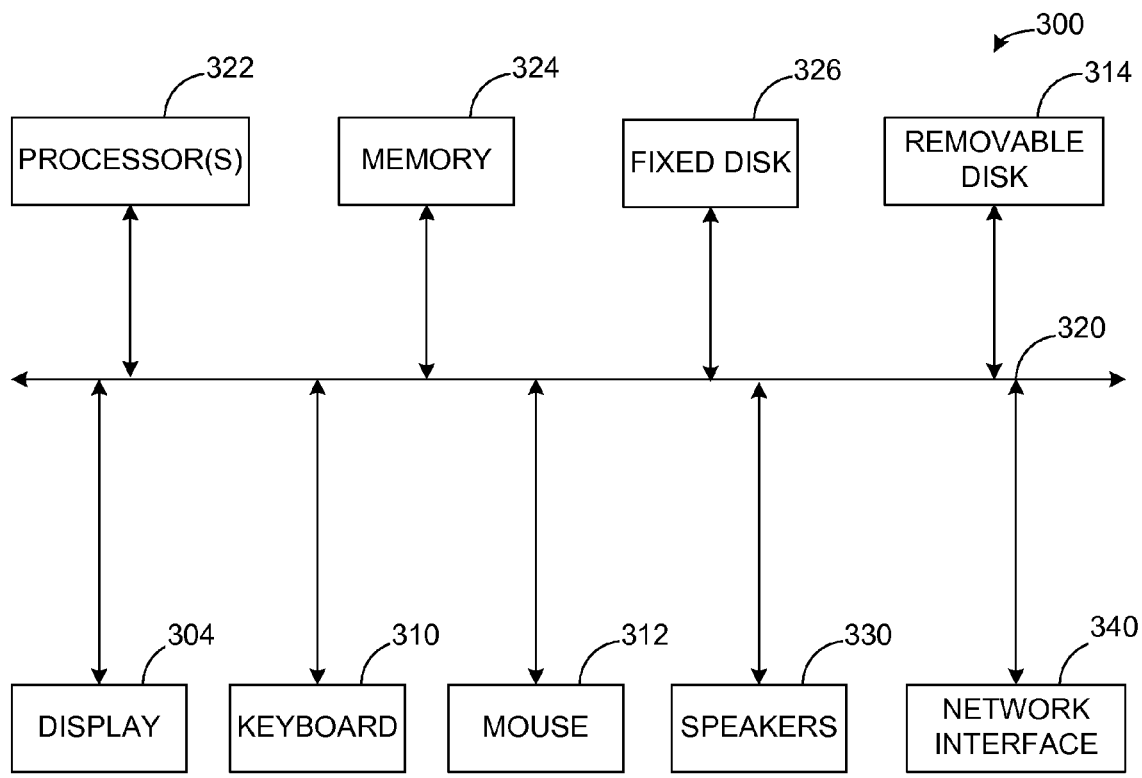

FIGS. 3A and 3B illustrate a computer system, which is suitable for implementing the control circuitry 270 used in one or more embodiments of the present invention. FIG. 3A shows one possible physical form of the computer system 300. Of course, the computer system may have many physical forms ranging from an integrated circuit, a printed circuit board, and a small handheld device up to a huge super computer. Computer system 300 includes a monitor 302, a display 304, a housing 306, a disk drive 308, a keyboard 310, and a mouse 312. Disk 314 is a computer-readable medium used to transfer data to and from computer system 300.

FIG. 3B is an example of a block diagram for computer system 300. Attached to system bus 320 is a wide variety of subsystems. Processor(s) 322 (also referred to as central processing units, or CPUs) are coupled to storage devices, including memory 324. Memory 324 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable type of the computer-readable media described below. A fixed disk 326 is also coupled bi-directionally to CPU 322; it provides additional data storage capacity and may also include any of the computer-readable media described below. Fixed disk 326 may be used to store programs, data, and the like and is typically a secondary storage medium (such as a hard disk) that is slower than primary storage. It will be appreciated that the information retained within fixed disk 326 may, in appropriate cases, be incorporated in standard fashion as virtual memory in memory 324. Removable disk 314 may take the form of any of the computer-readable media described below.

CPU 322 is also coupled to a variety of input/output devices, such as display 304, keyboard 310, mouse 312, and speakers 330. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 322 optionally may be coupled to another computer or telecommunications network using network interface 340. With such a network interface, it is contemplated that the CPU might receive information from the network, or might output information to the network in the course of performing the above-described method steps. Furthermore, method embodiments of the present invention may execute solely upon CPU 322 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of tangible computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level of code that are executed by a computer using an interpreter. Computer readable media may also be computer code transmitted by a computer data signal embodied in a carrier wave and representing a sequence of instructions that are executable by a processor.

Figure 4A:
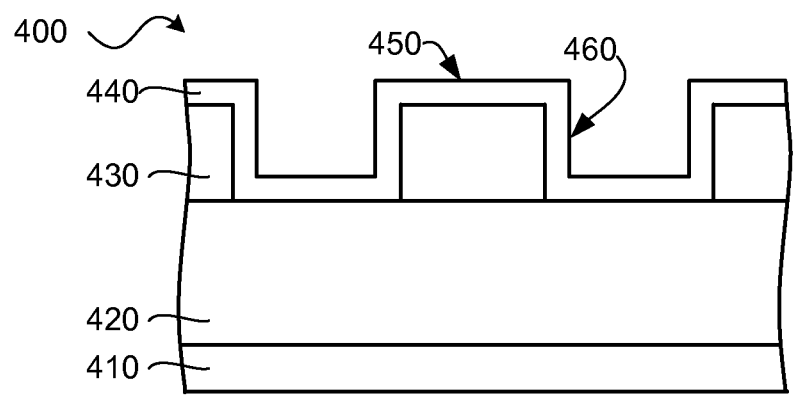
FIGS. 4A-E are schematic views of a stack processed according to an embodiment of the invention.

To facilitate understanding of the invention, FIGS. 4A-E are schematic views of a stack processed according to an embodiment of the invention. FIG. 4A is a schematic cross-sectional illustration of a stack 400 with a substrate 410, over which an intermediate layer 420 is provided. A feature layer 430 is present over the intermediate layer 420. In this embodiment, the feature layer 430 is polysilicon, which may be used to form a gate. A spacer layer 440 is formed over the feature layer 430. The spacer layer 440 has horizontal surfaces 450 and sidewall surfaces 460, which in this example are vertical surfaces. Although the intermediate layer 420 is shown on the substrate 410, in other embodiments there may be any number of intermediate layers over the substrate 410. In an embodiment with no intermediate layer, the feature layer 430 may be formed on a surface of the substrate.

Prior to placing the substrate 410 in the plasma chamber, the chamber walls of the plasma processing chamber are coated with a thin silicon oxide layer (step 102). In one example of this process a process gas is $SiCl_4$, $O_2$, and He is provided into the chamber, without a substrate. The process gas is transformed to a plasma. The plasma provides a silicon oxide coating over the chamber walls.

Figure 4B:
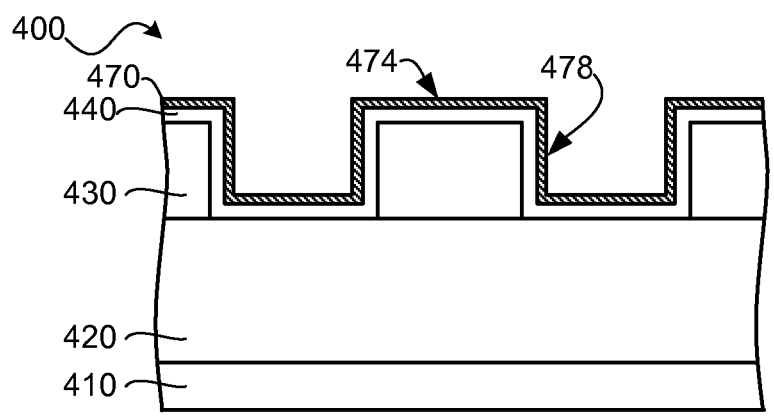

The substrate 410 is placed in the plasma chamber 204 (step 104), which is shown as wafer 206 in FIG. 2. A plasma oxidation treatment is provided to the wafer (step 108). In this example, a plasma oxidation treatment gas is provided to the chamber, by providing 200 sccm $O_2$ into the chamber at a pressure of 10 mTorr. The plasma oxidation treatment gas is formed into a plasma by providing 1000 watts at 13.6 MHz from the TCP power supply 251 to the TCP coils 253 and 100 volts of bias power from the bias power supply 256, while the electrostatic chuck (ESC) is maintained at a temperature of 60° C. When the plasma oxidation treatment is completed, the flow of the plasma oxidation treatment gas is stopped. The plasma oxidation treatment forms a silicon oxide coating 470 over the spacer layer 440, as shown in FIG. 4B. The silicon oxide coating 470 has a horizontal coating 474 on horizontal surfaces of the spacer layer and sidewall coatings 478 on the sidewall surfaces of the spacer layer. The silicon oxide layer coating may be very thin and is not drawn to scale, for illustrative purposes.

In other embodiments, a longer plasma oxidation treatment may be used to grow a thicker silicon oxide coating. In other embodiments, preferably the bias voltage is greater than 25 volts. Preferably the gas used for the plasma oxidation treatment consists essentially of oxygen or oxygen and an inert diluent. More preferably the gas used for the plasma oxidation treatment consists essentially of oxygen.

Figure 4C:
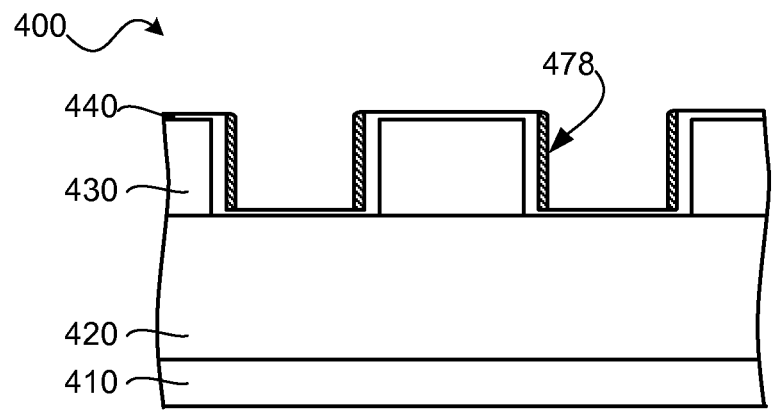

An anisotropic main etch is provided that selectively etches horizontal surfaces of the spacer layer and silicon oxide coating with respect to sidewall surfaces of the spacer layer and the sidewall coatings of the silicon oxide coating (step 112). Preferably the anisotropic main etch has a low selectivity or non-selective to silicon oxide, so that the silicon oxide and spacer layer are etched at about the same rate, and can quickly break through the silicon oxide coating on the horizontal surfaces. An example of an anisotropic main etch would provide a main etch gas comprising $CF_4$, HBr, and $O_2$ at a pressure of 2-10 mTorr. A TCP power of 200-600 Watts is supplied, with a bias voltage of 50 to 200 volts. In this example, the anisotropic main etch etches away all of the horizontal portions of the silicon oxide coating 470 and at least some of the horizontal portions of the spacer layer 440, leaving sidewall coatings 478 of the silicon oxide coating on the sidewall surface of the spacer layer 440, as shown in FIG. 4C.

Figure 4D:
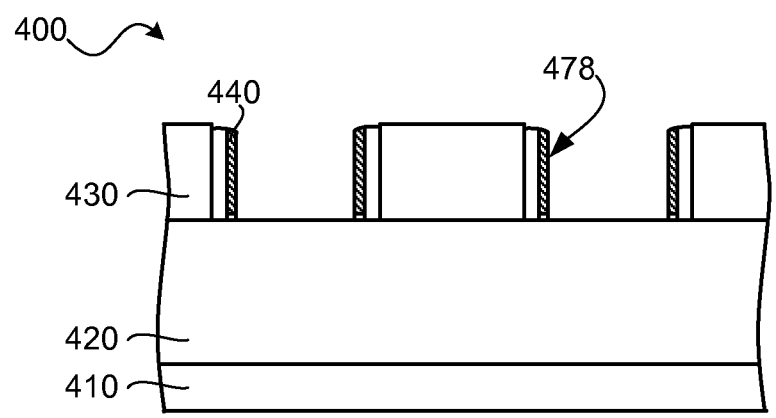

The spacer layer is selectively etched with respect to the silicon oxide layer (step 116) so that the sidewall coatings protect the sidewall surfaces of the spacer layer. Preferably, this etch highly selectively etches the spacer layer with respect to the silicon oxide layer. In this example, the selective etch etches away the remaining horizontal portions of the spacer layer, as shown in FIG. 4D. The resulting structure provides spacers with vertical sidewalls. In another example the anisotropic main etch may also be used to etch the spacer layer. The above recipe of providing an etch gas comprising $CF_4$, HBr, and $O_2$ at a pressure of 2-10 mTorr and with a TCP power of 200-600 Watts is supplied, with a bias voltage of 50 to 200 volts may be used to accomplish this. This etch selectively etches the horizontal surfaces of the spacer layer with respect to the vertical surfaces of the sidewall coating.

The wafer may then be removed from the plasma processing chamber (step 120). The chamber is then cleaned after the wafer is removed (step 124). Therefore, in this embodiment, the chamber is coated before each wafer is added to the chamber and then cleaned after each wafer is removed from the chamber. These steps improve repeatability and uniformity. Subsequent processing steps are used to further form semiconductor devices, such as using the spacers as ion implantation masks or etch masks.

Figure 4E:
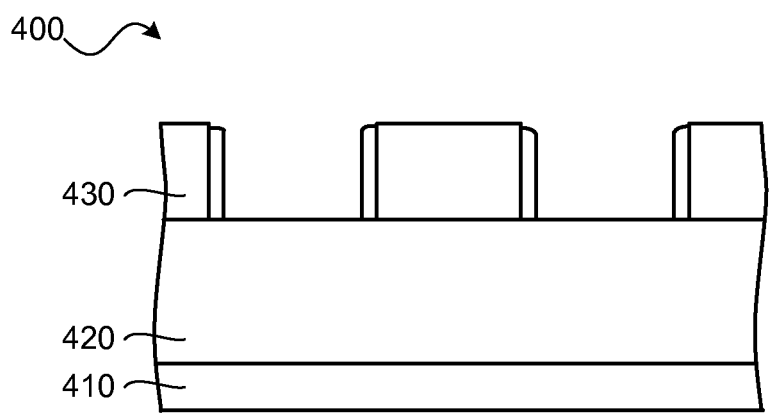

If a silicon oxide coating remains and it is desired to remove such a coating, a subsequent clean up step may be used. Such a clean up step would preferably be highly selective to silicon oxide with respect to the spacer layer. An example of such a clean up step would use a wet clean such as a DHF dip. FIG. 4E shows the stack after the silicon oxide coating has been removed. If the silicon oxide coating is sufficiently thin, some embodiments would not use a clean step and allow the silicon oxide coating to remain.

In this example, the silicon oxide coating allows the removal of horizontal portions of the spacer layer, while protecting the vertical sidewalls of the spacer layers, to form spacers with vertical sidewalls and minimal footing. In addition, the silicon oxide coating protects the spacer layer sidewalls from being etched laterally, thus providing improved CD control of the spacer layer sidewalls. It has been found that without the silicon oxide coating, the removal of footing causes the lateral etch of the spacer layer sidewalls. The silicon oxide coating was not drawn to scale, because preferably the silicon oxide coating is sufficiently thin to avoid footing, however such a thin coating would be more difficult to illustrate.

In addition, it is believed that the plasma oxidation treatment provides sufficient bias to cause sputtering silicon from the spacer layer, which coats the sidewall surface of the spacer layer to grow the CD of the sidewall of the spacer layer, while forming the silicon oxide coating.

In another embodiment, the plasma oxidation treatment may be tuned to provide different thicknesses of silicon oxide coating according to the distance from the center of the wafer. Such a variation of silicon oxide coating thickness may be used to compensate for other processes that vary according to radial distance from the center of the wafer. Such tuning may be accomplished by providing different power between the center and the edge of the wafer or by providing different gas concentrations or amounts between the center and edge of the wafer, or varying other parameters, or may be a resulting characteristic of a process.

In a preferred embodiment, before the wafer is placed into the plasma etch chamber, the chamber is coated with a silicon oxide layer. In such an embodiment, silicon may be sputtered from the chamber walls to form the silicon oxide layer on the spacer layer.

In other embodiments the silicon containing spacer layer preferably is silicon nitride, silicon, or silicon carbide.

The POT oxide provides a special passivation, which preserves the spacer top profile and prevents spacer CD loss during a main etch and over etch. Since the top spacer material is passivated by the oxide, the bottom spacer profile can be tuned without affecting the top profile. Without the POT oxide, the top spacer profile would normally be etched when the bottom profile is reshaped, which results in CD loss.

While this invention has been described in terms of several preferred embodiments, there are alterations, permutations, modifications, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. An apparatus for forming spacers from non-silicon oxide, silicon containing spacer layer with horizontal surfaces and sidewall surfaces over a substrate, comprising:
   a plasma processing chamber, comprising:
      a chamber wall forming a plasma processing chamber enclosure;
      a substrate support for supporting a substrate within the plasma processing chamber enclosure;
      a pressure regulator for regulating the pressure in the plasma processing chamber enclosure;
      at least one antenna for providing power to the plasma processing chamber enclosure for sustaining a plasma;
      at least one bias electrode for providing a bias voltage;
      a gas inlet for providing gas into the plasma processing chamber enclosure; and
      a gas outlet for exhausting gas from the plasma processing chamber enclosure;
   a gas source in fluid connection with the gas inlet, comprising;
      an oxygen gas source; and
      an anisotropic etch gas source;
   a controller controllably connected to the gas source, the at least one antenna, and at least one bias electrode, comprising:
      at least one processor; and
      non-transitory computer readable media having computer-executable instructions for performing a method comprising:
         providing a plasma oxidation treatment of a spacer layer to form a silicon oxide coating over the spacer layer, wherein the silicon oxide coating provides a horizontal silicon oxide coating on horizontal surfaces and sidewall silicon oxide coatings on sidewall surfaces of the spacer layer, the plasma oxidation treatment comprising:
            providing an oxygen plasma; and sputtering silicon to form silicon oxide using the oxygen plasma, wherein the sputtering of silicon deposits silicon oxide on the sidewalls to form the sidewall coatings;
         providing an anisotropic main etch that selectively etches horizontal surfaces of the spacer layer and silicon oxide coating with respect to sidewall surfaces of the spacer layer and the sidewall coatings of the silicon oxide coating;
         etching the spacer layer, wherein the sidewall coatings of the silicon oxide coating protect sidewall surfaces of the spacer layer;
         removing the substrate from the plasma etch chamber after etching the spacer layer, wherein the providing the plasma oxidation treatment, the anisotropic main etch, and etching the spacer layer are performed in the same plasma etch chamber using the antenna.

2. The apparatus, as recited in claim 1, the method further comprising: placing the substrate in a plasma etch chamber before providing the plasma oxidation treatment; and removing the substrate from the plasma etch chamber after etching the spacer layer, wherein the providing the plasma oxidation treatment, providing the anisotropic main etch, and etching the spacer layer are performed in the same plasma etch chamber using the antenna.

3. The apparatus, as recited in claim 2, wherein the providing the plasma oxidation treatment comprises the sputtering the silicon, which comprise providing a bias voltage of greater than 100 volts to the substrate.

4. The apparatus, as recited in claim 2, wherein the for providing the oxygen plasma, comprises: providing an oxidation gas consisting essentially of oxygen, or oxygen and an inert diluent; and forming a plasma from the oxidation gas.

5. The apparatus, as recited in claim 4, wherein the spacer layer is one of silicon or silicon nitride.

6. The apparatus, as recited in claim 5, the method further comprising forming a silicon oxide layer over surfaces of the plasma processing chamber before placing the substrate in the plasma processing chamber.

7. The apparatus, as recited in claim 6, wherein the providing the plasma oxidation treatment sputters silicon oxide from surfaces of the plasma processing chamber to provide silicon for the silicon oxide layer formed during the plasma oxidation treatment.

8. The apparatus, as recited in claim 7, the method further comprising removing the silicon oxide coating after etching the spacer layer and before removing the substrate from the plasma etch chamber.

9. The apparatus, as recited in claim 5, the method further comprising: removing the substrate from the plasma etch chamber; and
   cleaning the plasma etch chamber surfaces after the substrate is removed, wherein the forming the silicon oxide layer over the etch chamber surfaces is repeatedly performed before placing each substrate into the plasma etch chamber and the cleaning of the plasma etch chamber surfaces is repeatedly performed after each removing of the substrate.

10. The apparatus, as recited in claim 1, wherein the providing the oxygen plasma, comprises: providing an oxidation gas consisting essentially of oxygen; and forming a plasma from the oxidation gas.

11. The apparatus, as recited in claim 10, wherein the spacer layer is silicon or silicon nitride.

12. The apparatus, as recited in claim 1, the method further comprising forming a silicon oxide layer over plasma etch chamber surfaces before placing the substrate in the plasma etch chamber.

13. The apparatus, as recited in claim 12, wherein the providing the plasma oxidation treatment sputters silicon oxide from the plasma etch chamber to provide silicon for the silicon oxide layer formed during the plasma oxidation treatment.

14. An apparatus for forming spacers from a non-silicon oxide, silicon containing spacer layers with horizontal surfaces and sidewall surfaces over a plurality of substrates, comprising:
 a plasma processing chamber, comprising:
  a chamber wall forming a plasma processing chamber enclosure;
  a substrate support for supporting a substrate within the plasma processing chamber enclosure;
  a pressure regulator for regulating the pressure in the plasma processing chamber enclosure;
  at least one antenna for providing power to the plasma processing chamber enclosure for sustaining a plasma;
  at least one bias electrode for providing a bias voltage;
  a gas inlet for providing gas into the plasma processing chamber enclosure; and
  a gas outlet for exhausting gas from the plasma processing chamber enclosure;
 a gas source in fluid connection with the gas inlet, comprising;
  an oxygen gas source; and
  an anisotropic etch gas source;
 a controller controllably connected to the gas source, the at least one antenna, and at least one bias electrode, comprising:
  at least one processor; and
  non-transitory computer readable media having computer-executable instructions for performing a method comprising:
   forming of a silicon oxide layer over the plasma etch chamber surfaces before a placing of the substrate in the plasma etch chamber;
   placing a substrate of the plurality of substrates with a spacer layer that is silicon containing but non-silicon oxide containing in the plasma processing chamber enclosure before providing the plasma oxidation treatment;
   providing a plasma oxidation treatment to form a silicon oxide coating over the spacer layer, wherein the silicon oxide coating provides a horizontal silicon oxide coating on horizontal surfaces and sidewall silicon oxide coatings on sidewall surfaces of the spacer layer, the plasma oxidation treatment comprising:
    providing an oxygen plasma; and
    providing sputtering silicon to form silicon oxide with the oxygen plasma, wherein the of the plasma oxidation treatment sputters silicon oxide from the plasma etch chamber to provide silicon for the silicon oxide layer formed during the of the plasma treatment;
   providing a anisotropic main etch that selectively etches horizontal surfaces of the spacer layer and silicon oxide coating with respect to sidewall surfaces of the spacer layer and the sidewall coatings of the silicon oxide coating;
   etching the spacer layer, wherein the sidewall coatings of the silicon oxide coating protect sidewall surfaces of the spacer layer;
   removing the substrate from the plasma etch chamber after etching the spacer layer, wherein the providing the plasma oxidation treatment, providing the anisotropic main etch, and etching the spacer layer are performed in the same plasma etch chamber using the antenna; and
   repeating the previous steps until each of the plurality of substrates is processed.

15. The apparatus, as recited in claim 14, the method further comprising:
 cleaning the plasma etch chamber surfaces after the substrate is removed, wherein the forming the silicon oxide layer over the etch chamber surfaces is repeatedly performed before placing each substrate of the plurality of substrates into the plasma etch chamber and the cleaning the plasma etch chamber surfaces is repeatedly performed after each removing of the substrate of the plurality of substrates from the chamber.

* * * * *